(12) United States Patent
Schwartz et al.

(10) Patent No.: US 8,315,058 B2
(45) Date of Patent: Nov. 20, 2012

(54) CAPACITIVE TOUCH INTERFACE ASSEMBLY

(75) Inventors: Daniel Ronald Schwartz, Hopkins, MN (US); Steven John McCoy, Eden Prairie, MN (US); Jason Harold Rud, Mayer, MN (US)

(73) Assignee: Rosemount Inc., Eden Prairie, MN (US)

( * ) Notice: Subject to any disclaimer, the term of this patent is extended or adjusted under 35 U.S.C. 154(b) by 232 days.

(21) Appl. No.: 12/807,801

(22) Filed: Sep. 14, 2010

(65) Prior Publication Data
US 2012/0063101 A1   Mar. 15, 2012

(51) Int. Cl.
*H05K 7/00* (2006.01)
(52) U.S. Cl. .......................... 361/728; 361/752; 361/809
(58) Field of Classification Search .................. 361/679, 361/728–730, 752, 796, 800, 807, 809, 810; 439/493, 513; 200/314, 316, 600; 345/173, 345/174, 182; 324/658, 686
See application file for complete search history.

(56) References Cited

U.S. PATENT DOCUMENTS

| | | | |
|---|---|---|---|
| 4,136,291 A | | 1/1979 | Waldron |
| 4,302,647 A | * | 11/1981 | Kandler et al. ............... 200/512 |
| 4,754,106 A | | 6/1988 | Walker |
| 5,607,048 A | * | 3/1997 | Kaizu et al. .................. 200/314 |
| 5,847,690 A | | 12/1998 | Boie et al. |
| 5,917,165 A | | 6/1999 | Platt et al. |
| 6,664,489 B2 | | 12/2003 | Kleinhans et al. |
| 6,962,168 B2 | | 11/2005 | McDaniel et al. |
| 7,232,973 B2 | | 6/2007 | Kaps et al. |
| 7,255,466 B2 | * | 8/2007 | Schmidt et al. ............... 362/501 |
| 7,336,782 B2 | | 2/2008 | Watanabe et al. |
| 7,453,270 B2 | | 11/2008 | Hargreaves et al. |
| 7,511,242 B2 | | 3/2009 | Winkler |
| 7,515,140 B2 | | 4/2009 | Philipp |
| 7,518,381 B2 | | 4/2009 | Lamborghini et al. |
| 7,538,760 B2 | | 5/2009 | Hotelling et al. |
| 7,705,257 B2 | | 4/2010 | Arione et al. |
| 8,205,997 B2 | * | 6/2012 | Wu et al. ...................... 362/23 |
| 2008/0158181 A1 | | 7/2008 | Hamblin et al. |
| 2009/0008243 A1 | | 1/2009 | Lin et al. |
| 2009/0061115 A1 | | 3/2009 | Wang et al. |
| 2009/0107829 A1 | | 4/2009 | Heimann |
| 2009/0160820 A1 | | 6/2009 | Lii et al. |
| 2010/0024573 A1 | | 2/2010 | Daverman et al. |
| 2010/0079387 A1 | | 4/2010 | Rosenblatt et al. |

(Continued)

FOREIGN PATENT DOCUMENTS
JP       8139158 A     5/1996
(Continued)

*Primary Examiner* — Hung S Bui
(74) *Attorney, Agent, or Firm* — Kinney & Lange, P.A.

(57) ABSTRACT

A display assembly includes a transparent cover piece, a display shroud having a contact structure arranged to face the transparent cover piece, an interface subassembly mounted on the display shroud, an electronics board shroud having a support member and a connection feature, and a biasing member operably engaged between the display shroud and the electronics board shroud. The connection feature mechanically connects the electronics board shroud to the display shroud while permitting axial displacement and rotation therebetween. The biasing member rests on the support member of the electronics board shroud, and the biasing member is configured to urge the contact structure of the display shroud into physical contact with the transparent cover piece. The interface subassembly includes a display circuit for providing a digital display and a touch circuit for providing touch actuation at or near the digital display through the transparent cover piece.

33 Claims, 9 Drawing Sheets

U.S. PATENT DOCUMENTS

2010/0085327 A1   4/2010   Sleeman
2012/0200499 A1*  8/2012   Osterhout et al. ............ 345/158

FOREIGN PATENT DOCUMENTS

| JP | 2001215500 A | 8/2001 |
| JP | 2002190364 A | 7/2002 |
| KR | 20020050800 A | 6/2002 |
| WO | WO 2009123388 A1 | 10/2009 |
| WO | WO 2010014683 A2 | 2/2010 |
| WO | WO 2010039498 A2 | 4/2010 |

* cited by examiner

CAPACITIVE TOUCH INTERFACE ASSEMBLY

BACKGROUND

The present invention relates to capacitive touch interface assemblies and methods of manufacturing the same.

Industrial process transmitters are used in industrial process facilities in a variety of settings. For example, industrial process transmitters can include a sensor to sense pressure, temperature, vibration, flow, or nearly any other parameter associated with an industrial process, and/or can include an actuator or other device that manages, controls, or otherwise interacts with an industrial process. Many industrial process facilities are located in corrosive environments, or may be subject to a risk of fire, explosion, or vibration, and therefore industrial process transmitters must generally be constructed to be explosion-proof and otherwise able to suitable withstand operating environment conditions. The industrial process transmitter can communicate—wirelessly or using a hard-wired connection—with a control room, other device, etc. to help provide industrial process management. Typically, industrial process transmitters are installed at desired locations and are configured by an operator at the installation location using a programming device. However, such programming devices can be costly, and must be transported to the installation location for use by the operator. Yet it is desired to be able to configure industrial process transmitters without having to remove transmitter covers, because covers may be difficult to remove and then reinstall and cover removal undesirably exposes interior regions of the transmitters to the environment.

It is therefore desired to provide a local operator interface suitable for use with an industrial process transmitter.

SUMMARY

A display assembly according to the present invention includes a transparent cover piece, a display shroud having a contact structure arranged to face the transparent cover piece, an interface subassembly mounted on the display shroud, an electronics board shroud having a support member and a connection feature, and a biasing member operably engaged between the display shroud and the electronics board shroud. The connection feature mechanically connects the electronics board shroud to the display shroud while permitting axial displacement and rotation therebetween. The biasing member rests on the support member of the electronics board shroud, and the biasing member is configured to urge the contact structure of the display shroud into physical contact with the transparent cover piece. The interface subassembly includes a display circuit for providing a digital display and a touch circuit for providing touch actuation at or near the digital display through the transparent cover piece.

Figure 1:
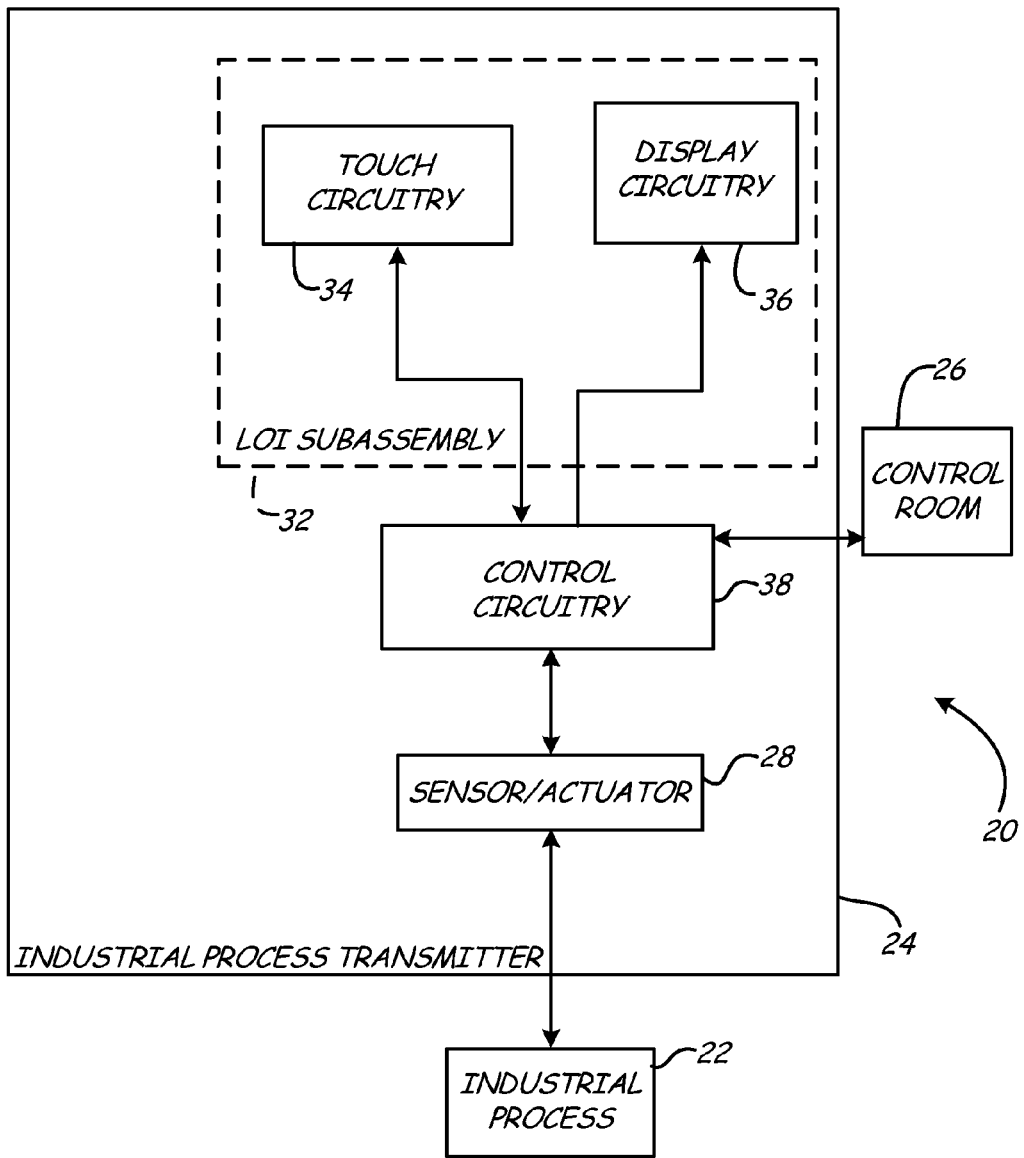
FIG. 1 is a block diagram illustrating an industrial process management system including an industrial process transmitter according to the present invention.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale. Like reference numbers have been used throughout the figures to denote like parts.

DETAILED DESCRIPTION

Industrial process transmitters are often used in environments that expose the transmitters to corrosion, fire, explosion, vibration, and other extreme conditions. For that reason, industrial process transmitters are specially constructed so that they can suitably withstand anticipated operating conditions. To that end, industrial process transmitters typically have rugged housings made of durable cast and machined metallic materials with a threadably attached (i.e., screw-on) cover. The cover can include a transparent portion positioned over a local interface subassembly. In order to meet explosion-proof requirements, the transparent portion is often provided as a relatively thick (e.g., approximately 10 mm or more) piece of glass.

It is desirable to have inputs to the industrial process transmitter that can be actuated without removing the cover from the housing and exposing an interior of the industrial process transmitter to the environment. Sensing a capacitive signal with touch circuitry having one or more conductive pads (or buttons) is possible through a dielectric material like glass or plastic that forms the transparent portion of the cover. The conductive pad of the touch circuitry and a human finger (or other appendage) form a capacitor separated by the dielectric forming transparent portion of the cover. Signal strength of the capacitive measurement is related to the dielectric, with better signal detection resulting from higher dielectric separating material. For that reason, a relatively thick transparent portion of the cover may be undesirable with respect to signal strength. Furthermore, any air gap in the capacitor will further reduce signal strength, so the amount of air should be minimized to maintain acceptable signal levels. Therefore, it is desirable to reduce or eliminate an air gap between the touch circuitry and the glass of the cover. However, because industrial process transmitters typically have a threaded cover, which is desirable for meeting explosion-proof requirements, the torque exerted when engaging (or disengaging) the cover with the transmitter housing could possibly disrupt, damage or even destroy sensitive display and/or touch circuitry if the cover contacts that circuitry. Vibrations can also lead to similar damage if circuitry is in physical contact with the cover. It should also be noted that although touch interfaces other than capacitive types are available, certain other types of touch interfaces are unsuitable for use in typical industrial process environments. For example, touch screens that utilize a deformable touch layer may be unsuitable for maintaining an explosion-proof industrial process transmitter enclosure.

In general, the present invention provides a display assembly suitable for use with an industrial process transmitter configured to meet operating environment requirements, such as being explosion-proof. The industrial process transmitter can include a housing, an interface subassembly, and a removable cover having a transparent portion positioned over the local display subassembly. The interface subassembly includes a display circuit for providing a display of visual information and a capacitive touch circuit for providing touch actuation at or near the displayed visual information through the transparent cover piece. In one embodiment, the interface subassembly is configured in a chip-on-glass (COG) configuration with the capacitive touch circuit positioned over the digital display, such that capacitive touch actuation can correspond to a variety of different inputs as a function of the particular visual information provided by the display (and visible through the capacitive touch circuit). In other embodiments, the capacitive touch circuit provides one or more active areas (i.e., buttons) positioned generally outside of a display area of the digital display, such as at a periphery of the digital display.

In some embodiments, the interface subassembly is mounted to a display shroud having a contact structure (e.g., a perimeter ridge or lip, a plurality of bumps, etc.) arranged to face the transparent cover piece. The display shroud is supported by an electronics board shroud that includes a connection feature, with the connection feature mechanically connecting the electronics board shroud to the display shroud while permitting axial displacement and rotation therebetween. The electronics board shroud can be attached to the housing with suitable fasteners. In addition, a biasing member, such as a wave spring, is operably engaged between the display shroud and the electronics board shroud. The biasing member rests on a portion of the electronics board shroud, and is configured to urge the contact structure of the display shroud into physical contact with the transparent cover piece.

Furthermore, in some embodiments, an air gap can be completely eliminated. Buttons of capacitive touch circuitry can be embedded in a shroud that physically contacts a transparent cover piece exposed to a user, such that a capacitive touch field path can extend from a user's appendage to a selected one of the buttons through only solid material. Such a configuration can optionally be used in conjunction with features of other embodiments, such as in conjunction with a biasing member to urge physical contact between the shroud and the transparent cover piece.

FIG. 1 is a block diagram illustrating an industrial process management system 20 that includes an industrial process 22, an industrial process transmitter 24, and a control room 26. The industrial process transmitter 24 includes a sensor/actuator 28, and a local operator interface (LOI) subassembly 32, which includes capacitive touch circuitry 34 and display circuitry 36. Control circuitry 38 is also provided.

The control room 26 can include displays, processors, memory, asset management or control software (e.g., AMS Suite and PlantWeb® software available from Emerson Process Management, Chanhassen, Minn.), and other components for managing and controlling the industrial process 22 and for collecting and analyzing data from the industrial process transmitter 24.

The sensor/actuator 28 is positioned to interact with the industrial process 22. In various embodiments the sensor/actuator 28 can be configured to sense pressure, temperature, vibration, flow, or nearly any other parameter associated with the industrial process 22 and/or can include an actuator or other device that manages, controls, or otherwise interacts with the industrial process 22. The control circuitry 38 is electrically connected to the sensor/actuator 28, and can be of any suitable configuration for controlling operation of the sensor/actuator 28, gathering data, processing data, etc. It should be noted that in alternative embodiments can be implemented as a plurality of discrete circuitry subassemblies, and separate control circuitry (not shown) can be provided for the sensor/actuator 28.

The LOI subassembly 32 includes the touch circuitry 34, which can be of any suitable configuration to enable touch actuation by an operator, and the display circuitry 36, which can be configured as one or more liquid crystal displays (LCDs) with optional backlighting functionality, or as any other type of digital or analog display capable of producing a visual output. In one embodiment, the touch circuitry 34 provides one or more touch actuatable regions defined by electrically conductive pads (or buttons) for selectively forming a capacitor with an appendage (e.g., finger) of an operator positioned near any of those regions of the touch circuitry 34. In that way, the touch circuitry 34 can provide capacitive touch actuation in a known manner. It will be appreciated that the conductive pads or buttons defining the touch actuatable regions of the touch circuitry 34 can have any suitable configuration, as desired for particular applications. In one embodiment, the touch circuitry 34 can have substantially transparent electrical traces (e.g., formed of indium-tin-oxide material) supported on glass layers with at least a portion of the touch circuitry 34 positioned over (i.e., on top of) the display circuitry 36, such that the display circuitry 36 is visible through the touch circuitry 34. This allows the display circuitry 36 to display essentially any information, and for the touch actuatable regions of the touch circuitry 34 to receive a variety of different inputs correlated to information displayed at each button of the touch circuitry 34. In that way, the LOI subassembly 32 provides for a dynamic operator interface that can display a variety of information and receive a variety of inputs within a relatively small area. Those of ordinary skill in the art will appreciate that any suitable menu and display layout can be provided by the LOT subassembly 32 as desired for particular applications. In alternative embodiments, the touch circuitry 34 and the display circuitry 36 could be located adjacent to one another or in other arrangements instead of being directly on top of one another. Additionally, in some embodiments, the touch circuitry 34 and the display circuitry 36 can each have a chip-on-glass (COG) configuration.

The control circuitry 38 controls operation of both the touch circuitry 34 and the display circuitry 36. For example, the control circuitry 38 can control the generation of displays on the display circuitry 36 and the recognition and processing of operator actuation of the touch circuitry 34. The control circuitry 38 can include one or more processors of conventional configurations.

The industrial process transmitter 24 can communicate with the control room 26. Communication between the industrial process transmitter 24 and the control room 26 can be through any suitable wireless or hard-wired connection. Moreover, communication with the control room 26 can be direct or through a network of any number of intermediate devices (not shown). The control circuitry 38 can help manage and control communication to and from the industrial process transmitter 24.

The industrial process transmitter 24 can include additional components not specifically shown in FIG. 1. Moreover, it will be appreciated that the particular configuration of the industrial process transmitter 24 can vary as desired for particular applications.

Figure 2:
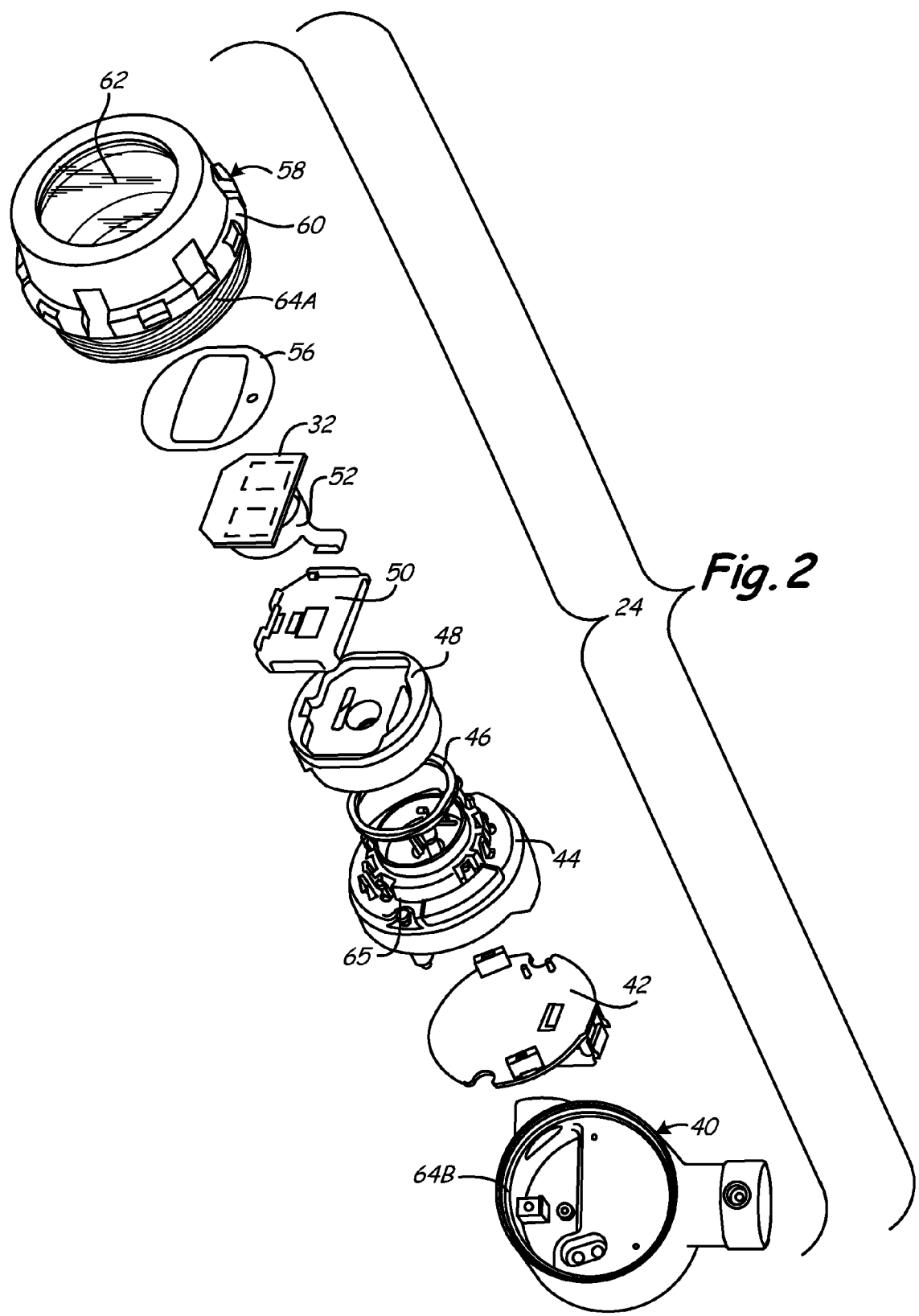
FIG. 2 is an exploded perspective view of portions of the industrial process transmitter.

FIG. 2 is an exploded perspective view of portions of one embodiment of the industrial process transmitter 24. As shown in FIG. 2, the industrial process transmitter 24 includes a housing 40, an electronics board 42, an electronics board shroud 44, a biasing member 46, a display shroud 48, a carrier 50, a flex circuit 52, a LOI subassembly 32, a label 56, and a cover 58.

The housing 40 can have a generally cylindrical shape. The housing can be made of any suitable materials, such as metallic or polymer materials. Known manufacturing processes can be used to make the housing 40, such as casting, machining and molding processes, or any other suitable manufacturing processes. The cover 58 includes a cover chassis 60 and a transparent cover piece 62. The cover chassis 60 can be made of a metallic material, a polymer material or other suitable material, and has a generally cylindrical shape. The transparent cover piece 62 is fixed to the cover chassis 60, and can be made of glass that is approximately 10 mm or more thick. Threads 64A are formed on the cover chassis 60 for threadably engaging the cover 58 to the housing 40 at corresponding housing threads 64B. Suitable seals (e.g., o-rings, gaskets, etc.) (not shown) can be provided for sealing the industrial process transmitter 24 from an exterior environment when the cover 58 is engaged to the housing 40. In the illustrated embodiment, the cover 58 and the housing, when engaged together, provide a sealed, fire-proof, and explosion-proof enclosure for the industrial process transmitter 24.

In general, the LOI subassembly 32 is supported by the carrier 50, which is in turn attached to the display shroud 48. The LOI subassembly 32 incorporates the touch circuitry 34 and the display circuitry 36, which can each be provided on a suitable number of glass layers. The carrier 50 can be molded from a polymer material, and provides a support structure to simplify handling of the LOI subassembly 32 during assembly of the industrial process transmitter 24. The label 56 is affixed over the LOI subassembly 32 at a side arranged to face the transparent cover piece 62, and can provide desired visual indications. The biasing member 46 can be a spring or collection of springs, such as a wave spring (e.g., having a load of approximately 89 newtons (20 lb.) at a working height of approximately 5.1 mm (0.2 inch)), and is operatively engaged between the display shroud 48 and the electronics board shroud 44. The electronics board 42 contains the control circuitry 38, which can include a processor and any other desired electrical components of known configurations, and as mechanically secured to the electronics board shroud 44. The electronics board shroud 44 is secured with suitable fasteners 65 (e.g., bolts, screws, etc.) to the housing 40.

The electronics board 42 is electrically connected to the LOI subassembly 32 by the flex circuit 52, which extends through the carrier 50, the display shroud 48 and the electronics board shroud 44. Although in the illustrated embodiment the flex circuit 52 is configured to have electrical traces printed on a flexible dielectric substrate, it should be understood that the flex circuit 52 can have any suitable configuration in alternative embodiments, such as a group of discrete wires, etc. At least a portion of the flex circuit 52 can be arranged in a coil shape, thereby permitting rotation of the display shroud 48 relative to the electronics board shroud 44 while maintaining electrical connections. The flex circuit 52 can be electrically connected to the LOI subassembly 32 with a hot bar anisotropic glue connection, and the flex circuit 52 can further be electrically connected to the electronics board 42. In order to reduce stress on electric connections to the flex circuit 52, the flex circuit 52 can be mechanically secured to LOI subassembly 32 components, such as by being threaded through slots on the carrier 50 or being glued to the carrier 50. The electronics board 42 is further electrically connected to additional circuitry (not shown) located inside the housing 40.

Figure 3:
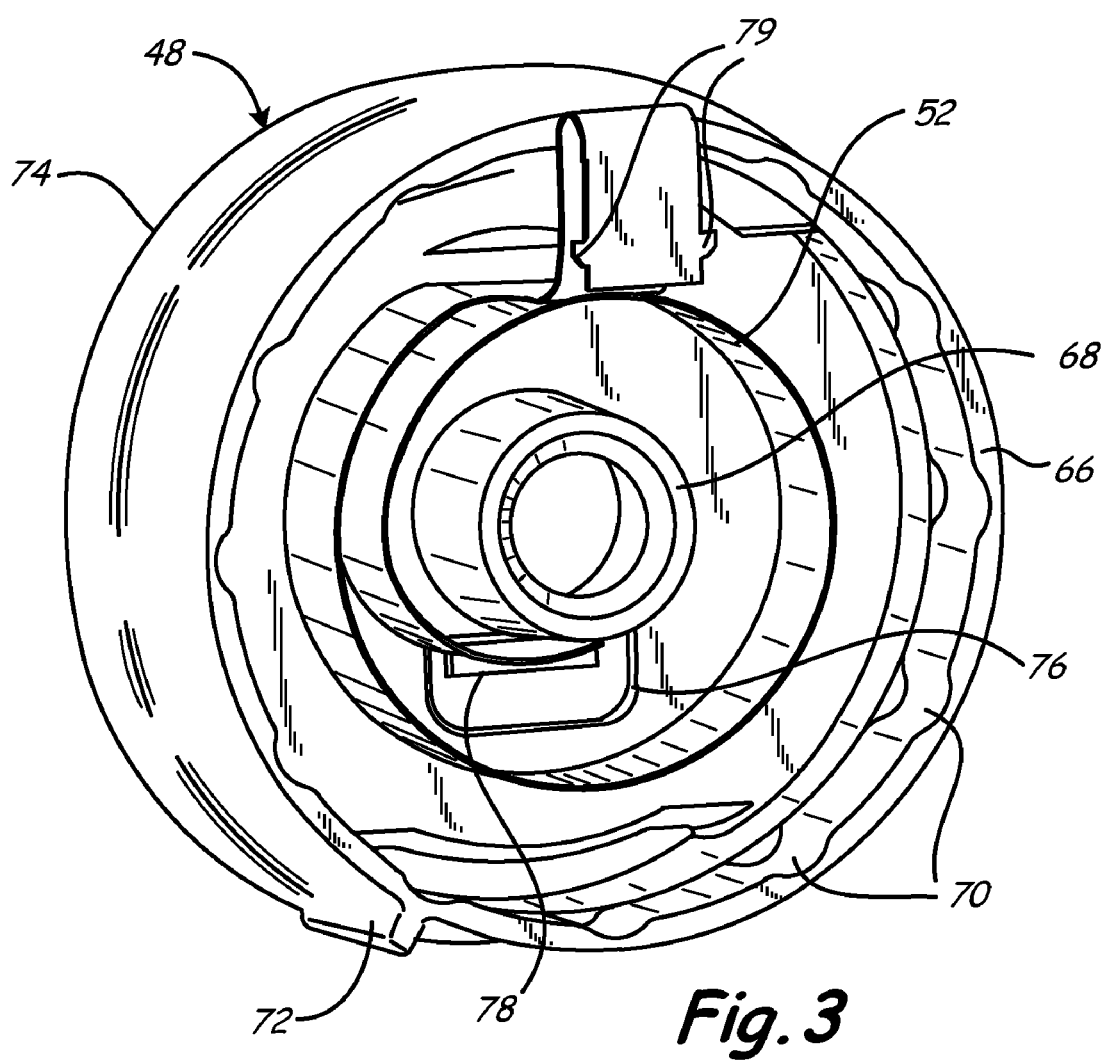
FIG. 3 is a perspective view of a display shroud subassembly of the industrial process transmitter.

FIG. 3 is a perspective view of an embodiment of a display shroud subassembly. As shown in FIG. 3, the illustrated embodiment of the display shroud 48 includes a cylindrical member 66 and a generally centrally-located connection feature 68 both arranged to face away from the carrier 50 (see FIGS. 2 and 5). The cylindrical member 66 is located at or near an outer diameter of the display shroud 48. A plurality of detent notches 70 are optionally provided along an inner surface of the cylindrical member 66. In the illustrated embodiment, twelve detent notches 70 are provided spaced approximately 30° apart from one another. In alternative embodiments, any desired number of detent notches 70 can be provided at any desired spacing (e.g., 15° intervals, 45° intervals, etc.). A stop 72 is located at an outer surface of the cylindrical member 66 for help to limit rotation of the display shroud 48, as will be explained further below. The display shroud 48 further includes a raised structure 74 that protrudes from the display shroud 48 at a side opposite the cylindrical member 66. In the illustrated embodiment, the raised structure 74 is a continuous ridge at a perimeter of the display shroud 48, though in alternative embodiments other configurations are possible (e.g., a discontinuous ridge, a plurality of "bumps" or one or more protrusions of nearly any shape). In addition, the display shroud 48 has an opening 76 through which the flex circuit 52 can pass (the flex circuit 52 also passes through an opening 78 in the carrier 50). The display shroud 48 can be molded from a polymer material. As shown in FIG. 3, the flex circuit 52 can include retention features 79 that facilitate electrically connecting the flex circuit 52 to the electronics board 42.

Figure 4:
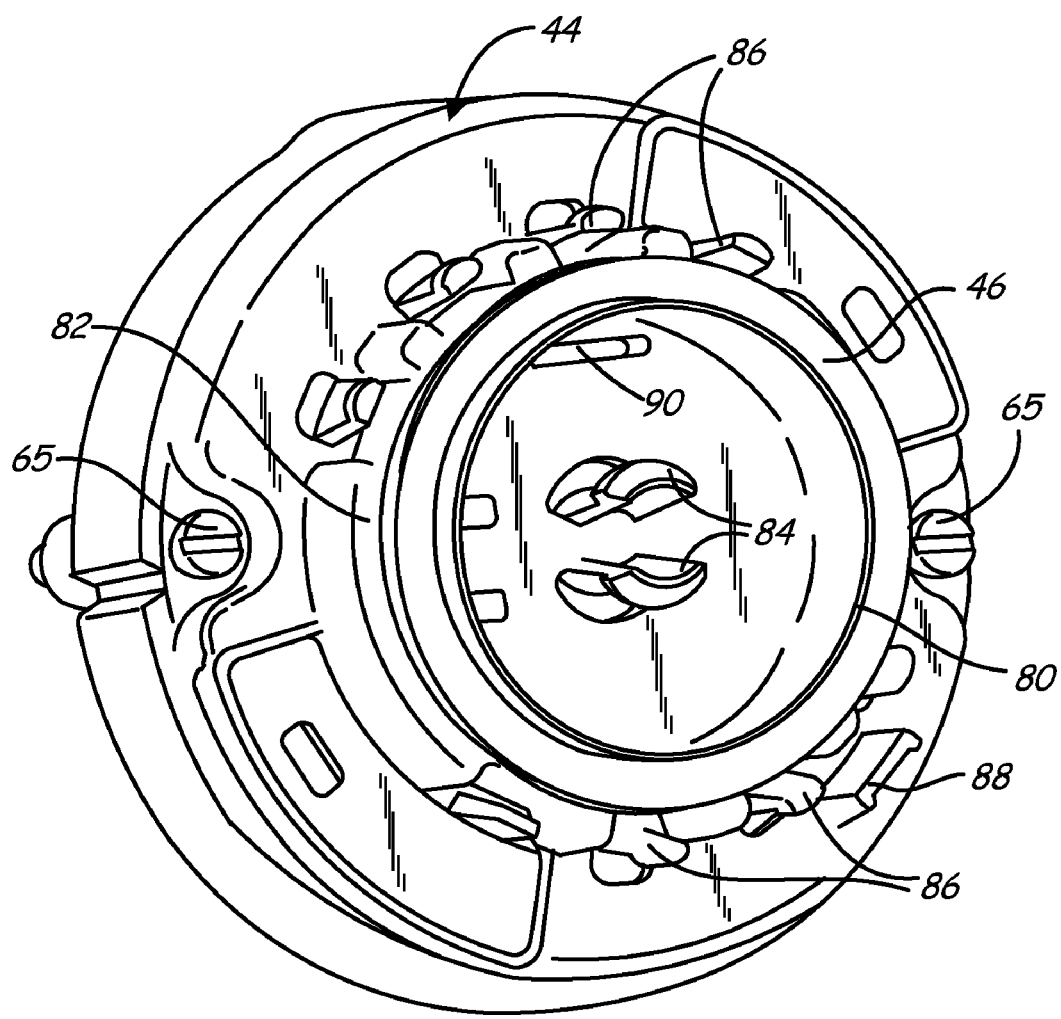
FIG. 4 is a perspective view of an electronics board shroud subassembly of the industrial process transmitter.

FIG. 4 is a perspective view of an embodiment of an electronics board subassembly. As shown in FIG. 4, the illustrated embodiment of the electronics board shroud 44 includes a cylindrical member 80, a support member 82 (i.e., land), a connection feature 84, one or more detent tabs 86, and a stop 88. The electronics board shroud 44 also has an opening 90 through which the flex circuit 52 can pass. The connection feature 84 is centrally located, and in the illustrated embodiment includes a pair of resilient prong members configured to provide a "snap" engagement with the connection feature 68 of the display shroud 48. In alternative embodiments, a screw or other type of engagement between the connection features 68 and 84 can be utilized. The engagement between the connection feature 68 and the connection feature 84 allows for rotation (both clockwise and counterclockwise) and axial movement while still mechanically securing the electronics board shroud 44 and the display shroud 48 together. An axis of rotation is defined by the connection features 68 and 84. The cylindrical member 80 is located radially outward from the connection feature 84, and the support member 82 is located adjacent to and radially outward from the cylindrical member 80. The biasing member 46 is positioned around the cylindrical member 80 and rests upon the support member 82. As shown in FIG. 4, eight angularly spaced detent tabs 86 are located adjacent to the support member 82. Each detent tab 86 is a resilient member configured to engage the detent notches 70 in the display shroud 48 such that rotation of the display shroud 48 relative to the electronics board shroud 44 is urged to be in increments defined by the spacing between the detent notches 70 and the detent tabs 86. The detent tabs 86 and detent notches 70 also help reduce a risk of undesired rotation of the display shroud 48 due to torque produced when the cover 58 is threadably engaged to or disengaged from the housing 40. In alternative embodiments, the detent notches 70 and the detent tabs 86 can be omitted. The stop 88 is located adjacent to and radially outward from the detent tabs 86, and is configured to cooperate with the stop 72 on the display shroud 48 to limit rotation of the display shroud 48 relative to the electronics board shroud 44 (see FIG. 5). For example, the stops 72 and 88 can limit rotation of the display shroud 48 relative to the electronics board shroud 44 to a range of approximately 330° in one embodiment. Rotational limits help prevent disconnection or damage to electrical connections of the LOI subassembly 32. The electronics board shroud 44 can be molded from a polymer material.

Figure 5:
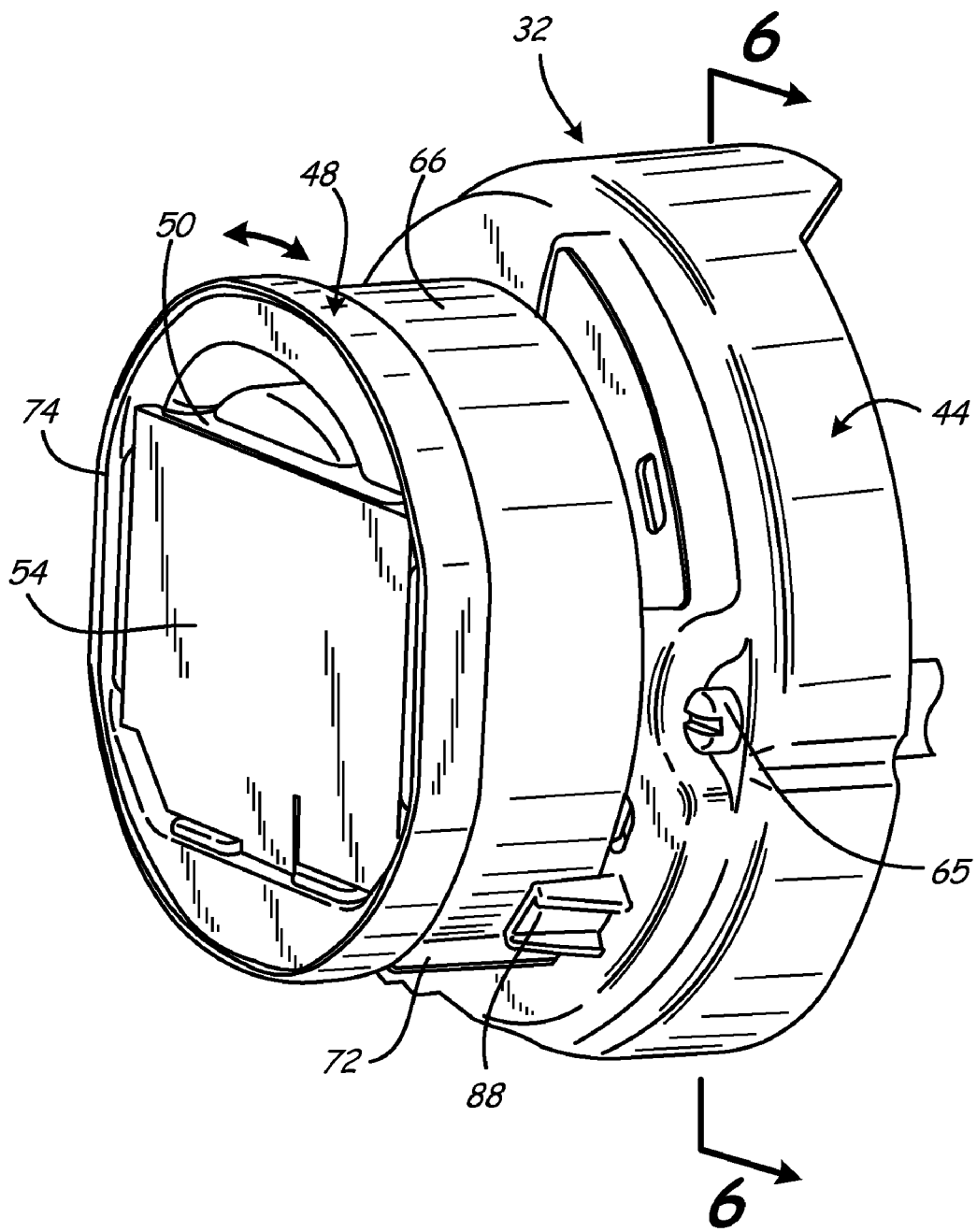
FIG. 5 is a perspective view of the display shroud subassembly and electronics board subassembly secured together.

FIG. 5 is a perspective view of the display shroud subassembly and the electronics board subassembly secured together. As shown in FIG. 5, the display shroud 48 is engaged with the electronics board shroud 44. Moreover, the LOI subassembly 32 mounted on the carrier 50 is secured to the display shroud 48. The LOI subassembly 32 and the carrier 50 are recessed relative to an outer extent of the contact structure 74 of the display shroud 48. In that way, the contact structure 74 is the furthest extending portion of the LOI subassembly 32, and can be configured as the only portion of the LOI subassembly 32 to physically contact the cover 58 of the industrial process transmitter 24. The distance that the LOI subassembly 32 is recessed from the outer extent of the contact structure 74 can be relatively closely controlled, such that an air gap between the transparent portion 62 of the cover 58 and the LOI subassembly 32 (which substantially corresponds to the distance that the LOI subassembly 32 is recessed from the outer extent of the contact structure 74) can be maintained at a small but non-zero value. Moreover, when the cover 58 is threadably engaged to or disengaged from the housing 40, torque from rotation of the cover 58 is exerted on the contact structure 74 of the display shroud 48 rather than on the relatively sensitive LOI subassembly 32.

When the display shroud 48 and the electronics board shroud 44 are connected together, the biasing member 46 urges the display shroud 48 and the electronics board shroud 44 away from each other in an axial direction. When the cover 58 is fully engaged with the housing 40, the transparent cover piece 62 contacts the contact structure 74 of the display shroud 48 and moves the display shroud 48 closer to the electronics board shroud 44, compressing the biasing member 46. A biasing force of the biasing member 46 urges the display shroud 48 into substantially continuous contact with the transparent cover piece 62 when the cover 58 is engaged to the housing 40. When the cover 58 is disengaged from the housing 40, the biasing member 46 urges the display shroud away from the electronics board shroud 44 up to an axial movement limit imposed by the connection features 68 and 84.

Figure 6:
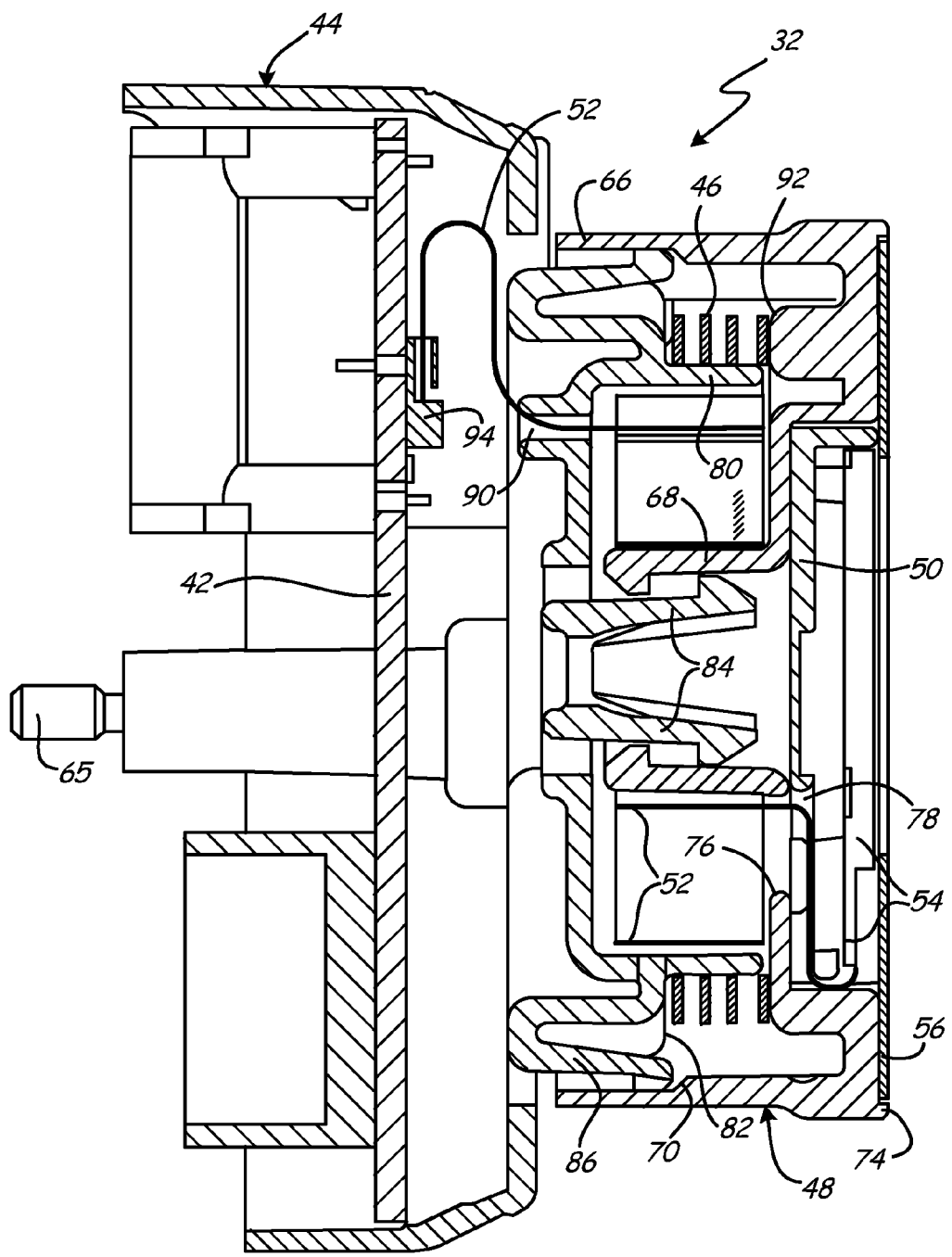
FIG. 6 is a cross-sectional view of the display shroud subassembly and electronics board subassembly secured together, taken along line 6-6 of FIG. 5.

FIG. 6 is a cross-sectional view of the display shroud subassembly and the electronics board subassembly secured together, taken along line 6-6 of FIG. 5. As shown in FIG. 6, the display shroud 48 includes a support member 92 (i.e., land) against which the biasing member 46 can rest. Moreover, the flex circuit 52 is electrically connected to the electronics board 42 with a zero insertion force (ZIF) connector 94 (available from Kyocera Corporation, Kyoto, Japan). It should be noted that the LOI subassembly 32 is shown without cross-hatching in FIG. 6 for simplicity.

Figure 7:
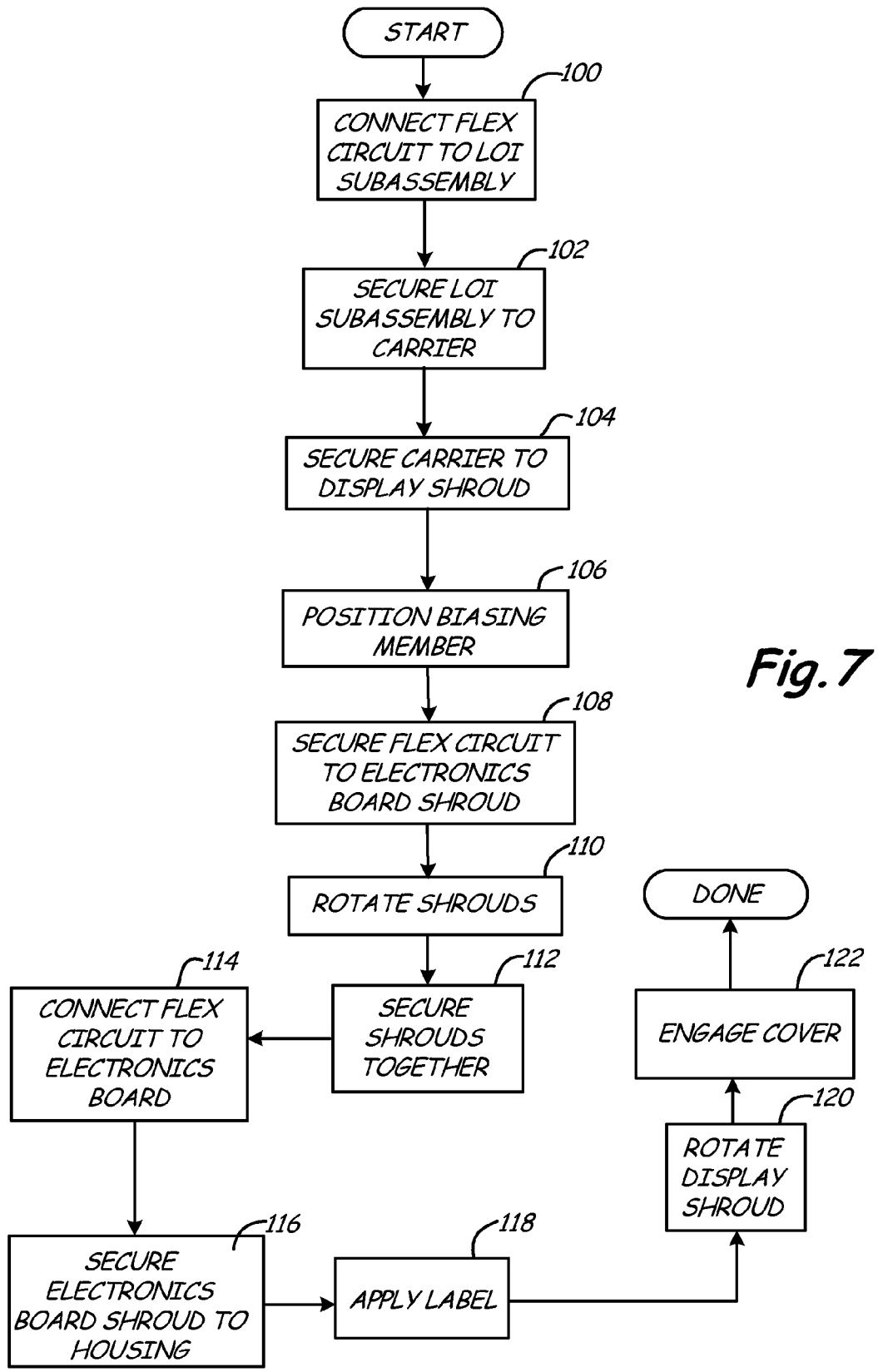
FIG. 7 is a flow chart illustrating a method for assembling an industrial process transmitter according to the present invention.

FIG. 7 is a flow chart illustrating one embodiment of a method for assembling the industrial process transmitter 24. Initially, the flex circuit 52 is electrically connected to the LOI subassembly 32 (step 100), and the LOI subassembly 32 is secured to the carrier 50 (step 102). Steps 100 and 102 can be performed in any suitable order. Step 100 can comprise heat sealing the flex circuit 52 to the LOI subassembly 32. The flex circuit 52 can also be mechanically secured to the carrier 50 at this point, such as being threaded through the opening 78, adhered to the carrier 50, etc. The LOI subassembly 32, the flex circuit 52 and the carrier 50 can be provided connected together as a unit that is relatively easily handled for subsequent assembly steps.

Next, the carrier 50 (with the LOI subassembly 32 supported thereon) is secured to the display shroud 48 (step 104). At step 104, the flex circuit 52 is threaded through the opening 76 in the display shroud 48. The biasing member 46 is then positioned to rest on the support member 82 of the electronics board shroud 44 (step 106), and the flex circuit 52 is mechanically secured to the electronics board shroud 44 (step 108). The retention features on the flex circuit 52 (e.g., additional retention features like feature 79) can be configured to allow essentially one-way insertion of an end of the flex circuit 52 through the opening 90 in the electronics board shroud 44, thereafter mechanically retaining the flex circuit 52 within the opening 90. However, any suitable mechanical attachment can be used. Once the flex circuit 52 is secured to the electronics board shroud 44, the display shroud 48 and the electronics board shroud 44 are rotated relative to one another (e.g., approximately 540°) to arrange the flex circuit 52 in a desired coil shape (step 110). Then the connection features 68 and 84 are engaged to secure the display shroud 48 and the electronics board shroud 44 together (step 112).

With the display shroud 48 and the electronics board shroud 44 secured together, the flex circuit 52 is electrically connected to the electronics board 42 (step 114). At step 114 the electronics board 42 can also be mechanically secured to the electronics board shroud 44, such as with a snap-locking connection. Next, the electronics board shroud 44 is secured to the housing 40 with the fasteners 65 (step 116). Also, the label 56 is adhered onto the LOI subassembly 32 (step 118). The label can be applied at any time, and can be applied at an earlier stage of the assembly process in alternative embodiments.

Next, the display shroud 48 is rotated relative to the electronics board shroud 44 and the housing 40 to position the LOI subassembly 32 at a desired orientation for operator viewing (step 120), and the cover 58 is threadably engaged with the housing 40 (step 122). Engagement of the cover 58 with the housing 40 brings the transparent cover piece 62 into contact with the contact structure 74 of the display shroud 48, and causes compression of the biasing member 42 to help maintain physical contact between the contact structure 74 of the display shroud 48 and the transparent cover piece 62 of the cover 58. Rotation of the display shroud 48 at step 120 can occur before or after the industrial process transmitter is installed for operation at a desired location. Moreover, the cover 58 can later be removed to allow for further rotational adjustment of the orientation of the display shroud 48 and the LOI subassembly 32.

It should be noted that assembly of the industrial process transmitter 24 according to the present invention can include additional steps not specifically mentioned. Moreover, in alternative embodiments of the method the order of particular assembly steps can vary as desired.

Figure 8:
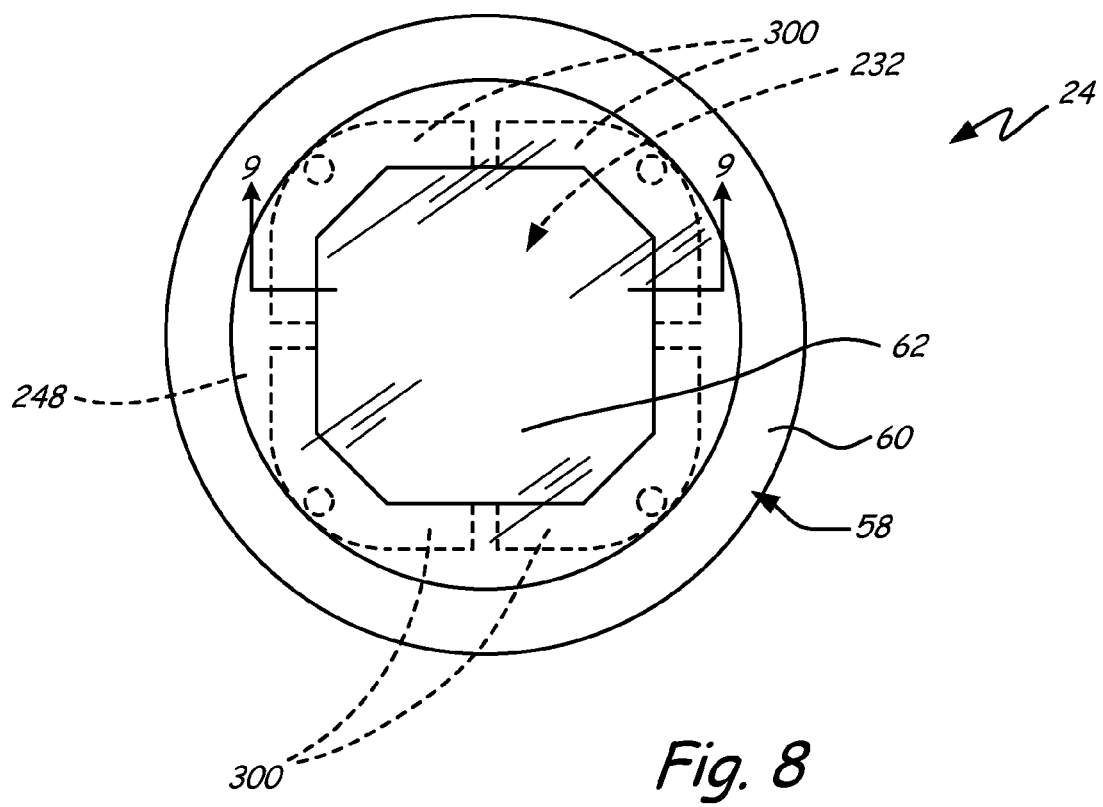
FIG. 8 is a plan view of a portion of an industrial process transmitter, showing another embodiment of a local operator interface (LOI) subassembly.
Figure 9:
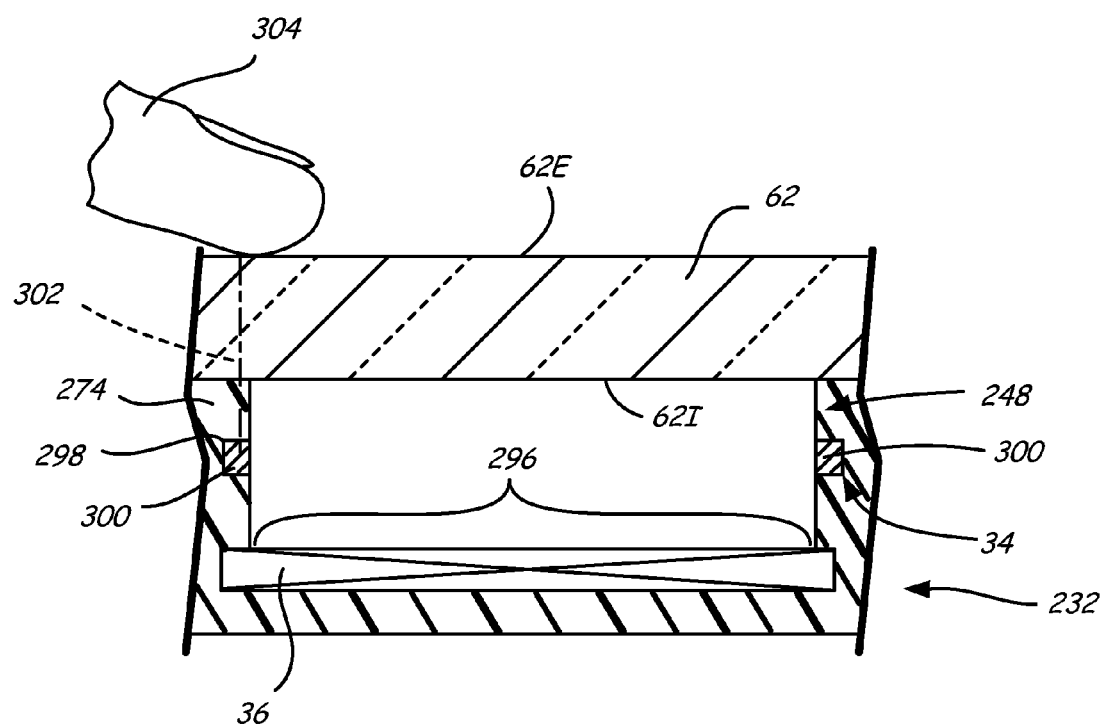
FIG. 9 is a cross-sectional view of the LOI subassembly of FIG. 8, taken along line 9-9 of FIG. 8.

FIG. 8 is a plan view of a portion of an industrial process transmitter 24, showing a cover 58 that includes a cover chassis 60 and a transparent cover piece 62 and another embodiment of a LOI subassembly 232. The cover 58 can have a configuration similar to previously described embodiments. FIG. 9 is a cross-sectional view of the LOI subassembly 232 and a portion of the transparent cover piece 62, taken along line 9-9 of FIG. 8. In the illustrated embodiment, the LOI subassembly 232 includes touch circuitry 34 (e.g., capacitive touch circuitry), display circuitry 36, and a display shroud 248 having a contact structure 274. The display circuitry 36 (shown only schematically in FIG. 9 for simplicity) is mounted on and supported by the display shroud 248, and defines a viewing area 296. In the illustrated embodiment, the viewing area 296 is an octagonal region at a central portion of the display circuitry 36 that is capable of producing a digital display. In further embodiments, the viewing area 296 can have nearly any configuration as desired for particular applications. The display circuitry 36 can incorporate one or more LCD screens, or other suitable display. Electrical connections to the display circuitry 36, while not shown in FIGS. 8 and 9, can be made in any suitable manner, such as those previously discussed with respect to other embodiments.

The contact structure 274 in the illustrated embodiment is positioned at or near a periphery of the display circuitry 36, and, more particularly, outwardly adjacent to a perimeter of the viewing area 296 of the display circuitry 36. In the illustrated embodiment, the contact structure 274 is a continuous ridge with a generally annular shape and has a central opening that allows the viewing area 296 of the display circuitry 36 to be visible through the transparent cover piece 62. In other embodiments the contact structure 274 can be discontinuous, and have nearly any suitable configuration. The transparent cover piece 62 defines an exterior surface 62E and an opposite interior surface 62I. The contact structure 274 is positioned to physically contact the interior surface 62I of the transparent cover piece 62. A biasing member, such as one similar or identical to the biasing member 46 described above but not shown in FIGS. 8 and 9, can be used to urge the contact structure 274 of the display shroud 248 against the transparent cover piece 62. Alternatively, the contact structure 274 can be positioned in contact with the transparent cover piece 62 by any other suitable means. The display shroud, including the contact structure 274, can be made of a suitable polymer material or a relatively low dielectric material.

One or more cavities 298 are formed in the display shroud 248. In the illustrated embodiment, four generally equally spaced cavities 298 are formed along an interior side of the contact structure 274. In alternative embodiments, the cavities 298 could be located at an exterior side of the contact structure 274, could extend all the way between the interior and exterior sides of the contact structure, could be unequally spaced, or otherwise vary from the illustrated configuration. Positioned at least partially within each of the cavities 298 is an electrically conductive button 300. The buttons 300 are thereby embedded in the display shroud 248 to form touch-sensitive regions of the touch circuitry 34, to allow for capacitive touch actuation by a user as will be explained in greater detail. In that respect, the buttons 300 would generally not be visible through the transparent cover piece 62 but instead would be hidden by material of the display shroud 248. The buttons 300 can have any suitable shape desired for a particular application. The buttons 300 can be layers of metallic material, and can be fabricated in any suitable manner. For example, the buttons 300 can be formed as stamped metal pieces that are inserted into the cavities 298 or overmolded with material of the display shroud 248 to simultaneously define cavities 298, or can be made as metallic material sputtered onto the material of the display shroud 248. Spacing between the buttons 300 and the transparent cover piece 62 can be less than or equal to approximately 0.0254 mm (0.001 inch) in some embodiments. As with previous embodiments, a label (not shown) can be provided on the display shroud 248 and over the locations of the buttons 300 to facilitate use.

A capacitive touch electrostatic field path 302 can be formed between a user's finger 304 at the exterior surface 62E of the transparent cover piece 62 and any of the buttons 300. In the illustrated embodiment, the field path 302 can extend substantially linearly from a user's appendage 304 through the transparent cover piece 62 and through at least a portion of the display shroud 248 (e.g., though a portion of the contact member 274) to a selected one of the buttons 300. The field path 302 between the exterior surface 62E of the transparent cover piece 62 and the selected button 300 generally passes only through solid material, and, more particularly, does not have to cross an air gap that would otherwise tend to decrease capacitive touch sensitivity. Thus, in the illustrated embodiment of FIGS. 8 and 9 an air gap can be eliminated entirely. Moreover, because the buttons 300 can be positioned at the periphery of the display circuitry 36, there is no need for the touch circuitry to be transparent or to be located on a glass supporting structure, which can help facilitate and simplify manufacture.

Those of ordinary skill in the art will appreciate that the present invention provides numerous advantages and benefits. For example, negative effects of tolerance variations of various industrial process transmitter components on operation of a local display subassembly are reduced with a touch screen display assembly according to the present invention. In particular, a fixed, rigid local display subassembly mounted to a transmitter housing would include tolerance variations due to a mounting surface on the cast and machined housing, each molded shroud (approximately +/−0.254 mm each in some applications), as well as LOI subassembly circuitry. The total tolerance variation for the assembly can be significant, and can make the provision of a small, well-controlled air gap between the local display subassembly circuitry and the transmitter cover unfeasible. However, a biasing member of the present invention can help a display shroud carrying display subassembly circuitry close to a transparent portion of the transmitter cover at a small and relatively well-controlled distance in order to help provide relatively good touch sensitivity while at the same time reducing a risk that vibration or torque on the transmitter cover will damage the LOI subassembly circuitry. Furthermore, embodiments of the present invention can allow for the elimination of an air gap in a capacitive touch interface of an industrial process transmitter, to increase capacitive touch sensitivity, while still maintaining an explosion-proof and environmentally sealed enclosure.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. For example, the particular shape of an industrial process transmitter can vary as desired for particular applications, and the particular configuration of display circuitry and/or touch circuitry can vary as desired for particular applications.

The invention claimed is:

1. A display assembly comprising:
   a transparent cover piece;
   a display shroud having a contact structure arranged to face the transparent cover piece;
   an interface subassembly mounted on the display shroud, the interface subassembly comprising:
      a display circuit for providing a digital display; and
      a touch circuit for providing touch actuation at or near the digital display through the transparent cover piece;
   an electronics board shroud having a support member and a connection feature, wherein the connection feature mechanically connects the electronics board shroud to the display shroud while permitting axial displacement and rotation therebetween; and
   a biasing member operably engaged between the display shroud and the electronics board shroud, wherein the biasing member rests on the support member of the electronics board shroud, and wherein the biasing member is configured to urge the contact structure of the display shroud into physical contact with the transparent cover piece.

2. The assembly of claim 1, wherein the transparent cover piece comprises glass at least approximately 10 millimeters thick.

3. The assembly of claim 1 and further comprising:
   a housing; and
   a cover chassis, wherein the transparent cover piece is secured to the cover chassis, and wherein the cover chassis is threadably secured to the housing.

4. The assembly of claim 3, wherein the electronics board shroud is fixedly secured to the housing.

5. The assembly of claim 1 and further comprising:
   a mechanical stop for limiting rotation of the display shroud relative to the electronics board shroud.

6. The assembly of claim 1, wherein the display shroud is rotatable relative to the electronics board shroud in approximately 30° increments.

7. The assembly of claim 1, wherein the contact structure comprises a ridge at a perimeter of the display shroud.

8. The assembly of claim 1 and further comprising:
   a flex member electrically connected to the interface subassembly for operably connecting at least one of the display circuit and the touch circuit to remotely located control circuitry.

9. The assembly of claim 8, wherein at least a portion of the flex member is arranged in a coil shape.

10. The assembly of claim 1 and further comprising:
    a plurality of alignment members protruding from the electronics board shroud adjacent to the support member, wherein the alignment members extend adjacent to a perimeter portion of the display shroud to promote alignment between the electronics board shroud and the display shroud.

11. The assembly of claim 1 wherein the transparent cover piece is removable, and wherein the connection feature holds the display shroud such that the biasing member is compressed when the transparent cover piece is removed.

12. The assembly of claim 1, wherein the interface assembly includes a display glass positioned within approximately 0.51-0.76 millimeters (20-30 mils) from the transparent cover piece.

13. The assembly of claim 1 and further comprising:
    a carrier, wherein the interface subassembly is mounted to the carrier, and wherein the carrier is secured to the display shroud.

14. The assembly of claim 1, wherein the biasing member comprises a wave spring.

15. The assembly of claim 1, wherein the touch circuit comprises:
    an electrically conductive button at least partially embedded within a portion of the display shroud, wherein the button is positioned at a periphery of the digital display and proximate the contact structure of the display shroud.

16. An industrial process transmitter assembly comprising:
    a housing;
    a cover comprising:
       a transparent cover piece; and
       a cover chassis, wherein the transparent cover piece is secured to the cover chassis, and wherein the cover chassis is threadably secured to the housing;
    a display shroud having a contact structure arranged to face the transparent cover piece of the cover;
    an interface subassembly mounted on the display shroud, the interface subassembly comprising:
       a display circuit for providing a digital display;
       a capacitive touch circuit for providing touch actuation at or near the digital display through the transparent cover piece;
    an electronics board shroud having a support member and a connection feature, wherein the connection feature mechanically connects the electronics board shroud to the display shroud while permitting axial displacement and rotation therebetween, and wherein the electronics board shroud is fixedly secured to the housing; and
    a spring operably engaged between the display shroud and the electronics board shroud, wherein the spring rests on the support member of the electronics board shroud, and wherein the spring is configured to urge the contact structure of the display shroud into physical contact with the transparent cover piece.

17. The assembly of claim 16 and further comprising:
    a mechanical stop for limiting rotation of the display shroud relative to the electronics board shroud.

18. The assembly of claim 16, wherein the contact structure comprises a ridge at a perimeter of the display shroud.

19. The assembly of claim 16, wherein the interface subassembly has a chip-on-glass configuration and a display glass of the interface subassembly is positioned within approximately 0.51-0.76 millimeters (20-30 mils) from the transparent cover piece.

20. The assembly of claim 16 and further comprising:
    a carrier, wherein the interface subassembly is mounted to the carrier, and wherein the carrier is secured to the display shroud.

21. The assembly of claim 16, wherein the spring is a wave spring.

22. The assembly of claim 16, wherein the capacitive touch circuit comprises:
    an electrically conductive button at least partially embedded within a portion of the display shroud, wherein the button is positioned at a periphery of the digital display and proximate the contact structure of the display shroud such that the button is separated from the transparent cover piece by solid material.

23. A method of assembling an industrial process transmitter, the method comprising:
    securing a first shroud and a second shroud together such that the first shroud is moveable relative to the second shroud, wherein the first shroud carries a capacitive touch circuit;
    securing the second shroud to a housing with fasteners;

threadably securing a cover having a transparent portion to the housing over the capacitive touch circuit; and biasing the first shroud into contact with the cover such that the capacitive touch circuit is positioned adjacent to the transparent portion of the cover.

24. The method of claim 23 and further comprising:

prior to the step of threadably securing the cover to the housing, rotating the first shroud relative to the second shroud to orient the capacitive touch circuit relative to the housing.

25. The method of claim 23 and further comprising:

prior to the step of securing the first shroud and the second shroud together, rotating the first shroud relative to the second shroud to coil a flex circuit extending therebetween.

26. A display assembly comprising:

a transparent cover piece having an exterior surface and an opposite interior surface;

a display shroud having a contact structure arranged in physical contact with the interior surface of the transparent cover piece;

a display circuit mounted on the display shroud for providing a digital display through the transparent cover piece; and a capacitive touch circuit for providing capacitive touch actuation through the transparent cover piece, the capacitive touch circuit including an electrically conductive button located at or near a periphery of the digital display, wherein the electrically conductive button is at least partially embedded within a portion of the display shroud such that a capacitive touch field path is formed substantially linearly through solid material by passing through the transparent cover piece and through the display shroud to the electrically conductive button.

27. The assembly of claim 26, wherein the electrically conductive button is embedded within the contact structure of the display shroud.

28. The assembly of claim 26, wherein the capacitive touch field path does not cross an air gap.

29. The assembly of claim 26, wherein the display shroud comprises a polymer material.

30. The assembly of claim 26 and further comprising:

an electronics board shroud having a support member and a connection feature, wherein the connection feature mechanically connects the electronics board shroud to the display shroud while permitting axial displacement and rotation therebetween; and a biasing member operably engaged between the display shroud and the electronics board shroud, wherein the biasing member rests on the support member of the electronics board shroud, and wherein the biasing member is configured to urge the contact structure of the display shroud into physical contact with the transparent cover piece.

31. The assembly of claim 26, wherein the electrically conductive button comprises a layer of metallic material.

32. The assembly of claim 26 and further comprising:

a housing; and a cover chassis, wherein the transparent cover piece is secured to the cover chassis, and wherein the cover chassis is threadably secured to the housing.

33. The assembly of claim 26, wherein the transparent cover piece comprises glass at least approximately 10 millimeters thick.

* * * * *

UNITED STATES PATENT AND TRADEMARK OFFICE
CERTIFICATE OF CORRECTION

| | | |
|---|---|---|
| PATENT NO. | : 8,315,058 B2 | |
| APPLICATION NO. | : 12/807801 | |
| DATED | : November 20, 2012 | |
| INVENTOR(S) | : Daniel Ronald Schwartz, Steven John Mccoy and Jason Harold Rud | |

It is certified that error appears in the above-identified patent and that said Letters Patent is hereby corrected as shown below:

Col. 4, Line 42
  Delete "LOT"
  Insert --LOI--

Signed and Sealed this
Second Day of April, 2013

Teresa Stanek Rea
*Acting Director of the United States Patent and Trademark Office*